US008785994B2

(12) United States Patent
Kim

(10) Patent No.: US 8,785,994 B2
(45) Date of Patent: Jul. 22, 2014

(54) X-RAY DETECTOR

(71) Applicant: Samsung Display Co., Ltd., Yongin-si (KR)

(72) Inventor: Dong-Hyuk Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/680,661

(22) Filed: Nov. 19, 2012

(65) Prior Publication Data

US 2014/0027828 A1 Jan. 30, 2014

(30) Foreign Application Priority Data

Jul. 27, 2012 (KR) .................. 10-2012-0082783

(51) Int. Cl.
*H01L 31/062* (2012.01)
*H01L 31/113* (2006.01)
*H01L 31/0232* (2014.01)

(52) U.S. Cl.
USPC .... 257/292; 257/294; 257/435; 257/E31.058; 257/E31.096; 257/E31.115; 257/E31.122; 257/E33.076; 257/E33.077

(58) Field of Classification Search
USPC .......... 257/292, 294, 435, E31.058, E31.096, 257/E31.115, E31.122, E33.076, E33.077
See application file for complete search history.

(56) References Cited

U.S. PATENT DOCUMENTS

| | | | | |
|---|---|---|---|---|
| 5,079,426 A * | 1/1992 | Antonuk et al. | ......... | 250/370.09 |
| 6,031,248 A * | 2/2000 | Mei et al. | ......... | 257/59 |
| 6,348,693 B1 * | 2/2002 | Weisfield et al. | ......... | 250/370.11 |
| 6,396,046 B1 * | 5/2002 | Possin et al. | ......... | 250/208.1 |
| 6,740,884 B2 * | 5/2004 | Lee et al. | ......... | 250/370.08 |
| 7,601,961 B2 * | 10/2009 | Franklin et al. | ......... | 250/370.09 |
| 7,638,772 B2 * | 12/2009 | Watanabe et al. | ......... | 250/370.08 |
| 7,915,595 B2 * | 3/2011 | Kim et al. | ......... | 250/370.11 |
| 7,982,190 B2 * | 7/2011 | Homma et al. | ......... | 250/370.11 |
| 8,044,445 B2 * | 10/2011 | Hayashi et al. | ......... | 257/292 |
| 8,067,745 B2 * | 11/2011 | Jung et al. | ......... | 250/370.09 |
| 8,174,087 B2 * | 5/2012 | Okada | ......... | 257/443 |
| 8,558,185 B2 * | 10/2013 | Tredwell | ......... | 250/370.09 |
| 2004/0251420 A1 | 12/2004 | Sun | | |
| 2006/0062352 A1 * | 3/2006 | Nomura et al. | ......... | 378/98.8 |
| 2008/0024402 A1 * | 1/2008 | Nishikawa et al. | ......... | 345/82 |

(Continued)

FOREIGN PATENT DOCUMENTS

| | | |
|---|---|---|
| KR | 10-2010-0076638 | 7/2010 |
| KR | 10-2010-0085515 A | 7/2010 |
| KR | 10-2010-0087819 A | 8/2010 |

*Primary Examiner* — Ida M Soward
(74) *Attorney, Agent, or Firm* — Christie, Parker & Hale, LLP

(57) ABSTRACT

An X-ray detector including: a substrate that is divided into a light detection area and a non-detection area and includes a plurality of pixels; a photodiode disposed on the light detection area; a thin film transistor that is disposed on the non-detection area and is electrically connected to a lower portion of the photodiode; a plurality of wires that are electrically connected to the thin film transistor and are positioned on the non-detection area; at least one insulating layer disposed so as to cover at least the thin film transistor and the plurality of wires; a scintillator layer disposed on the at least one insulating layer over an entire surface of the substrate; and a shielding part disposed between the at least one insulating layer and the scintillator layer to shield the non-detection area.

17 Claims, 10 Drawing Sheets

(56) References Cited

U.S. PATENT DOCUMENTS

2009/0057564 A1* 3/2009 Miyayama et al. ...... 250/370.09
2009/0084961 A1* 4/2009 Tonotani et al. .......... 250/361 R
2010/0163882 A1 7/2010 Jung
2012/0112081 A1* 5/2012 Tajima .................... 250/370.08

* cited by examiner

X-RAY DETECTOR

CROSS-REFERENCE TO RELATED PATENT APPLICATION

This application claims priority to and the benefit of Korean Patent Application No. 10-2012-0082783, filed on Jul. 27, 2012, in the Korean Intellectual Property Office, the disclosure of which is incorporated herein in its entirety by reference.

BACKGROUND

1. Field

Aspects of the present invention relate to an X-ray detector.

2. Description of the Related Art

X-rays are transmitted easily through objects due to their short wavelengths. The amount of X-rays transmitted through an object is dependent on the internal density of the object through which the X-rays are traveling. As a result, the interior of an object may be indirectly imaged based on an amount of X-rays transmitted through the object.

An X-ray detector is a device for detecting an amount of X-rays transmitted through an object. The X-ray detector may detect the amount of X-rays transmitted through the object and display an interior of the object on a display device. The X-ray detector may generally be used as a medical testing device and a non-destructive testing device.

Currently, flat panel digital radiography (DR) devices employing DR methods requiring no film are being widely used to display X-ray images.

An X-ray detector generates a signal current according to light incident on a photosensitive diode, such as a photodiode. The generated signal current is processed to be displayed as an image. However, a light scattering factor exists on a path of light incident on a photosensitive diode, and thus, the reproducibility of a fine portion of an image tends to deteriorate.

SUMMARY

Aspects of one or more embodiments of the present invention are directed toward an X-ray detector with an improved modulation transfer function (MTF).

According to an embodiment of the present invention, there is provided an X-ray detector including: a substrate that is divided into a light detection area and a non-detection area and comprises a plurality of pixels; a photodiode disposed on the light detection area; a thin film transistor that is disposed on the non-detection area and is electrically connected to a lower portion of the photodiode; a plurality of wires that are electrically connected to the thin film transistor and are positioned on the non-detection area; at least one insulating layer disposed so as to cover at least the thin film transistor and the plurality of wires; a scintillator layer disposed on the at least one insulating layer over an entire surface of the substrate; and a shielding part disposed between the at least one insulating layer and the scintillator layer to shield the non-detection area.

The X-ray detector may further include an adhesive layer between the shielding part and the scintillator layer.

The X-ray detector may further include a passivation layer between the adhesive layer and the scintillator layer.

The X-ray detector may further include a scintillator seed layer between the shielding part and the scintillator layer.

The shielding part may include at least one of an acryl-based organic material, an overcoat material, and a black matrix (BM).

The X-ray detector may include a device passivation layer that covers at least the thin film transistor and the photodiode and is disposed below the insulating layer; and a bias line that is disposed on the device passivation layer and is electrically connected to an upper portion of the photodiode through a contact hole. The bias line may be branched to be overlapped with the thin film transistor.

The X-ray detector may further include an additional shielding part between the device passivation layer and the insulating layer to shield the non-detection area.

The scintillator layer may include at least one of CSI and GdOS.

According to another embodiment of the present invention, there is provided an X-ray detector including: a substrate that is divided into a light detection area and a non-detection area and includes a plurality of pixels; a photosensitive element disposed on the light detection area; a circuit unit that is disposed on the non-detection area and is electrically connected to a lower portion of the photosensitive element; a plurality of wires that are electrically connected to the circuit unit and are disposed on the non-detection area; a device passivation layer disposed so as to cover at least the circuit unit and the plurality of wires; an insulating layer formed so as to cover the device passivation layer; a light wavelength conversion layer disposed on the insulating layer over an entire surface of the substrate; and a shielding part disposed between the insulating layer and the light wavelength conversion layer to shield the non-detection area.

The X-ray detector may further include an adhesive layer between the shielding part and the light wavelength conversion layer.

The X-ray detector may further include a passivation layer between the adhesive layer and the light wavelength conversion layer.

The X-ray detector may further include a seed layer between the shielding part and the light wavelength conversion layer.

The shielding part may include at least one of an acryl-based organic material, an overcoat material, and a black matrix (BM).

The X-ray detector may further include an additional shielding part between the device passivation layer and the insulating layer to shield the non-detection area.

The scintillator layer may include at least one of CSI and GdOS.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
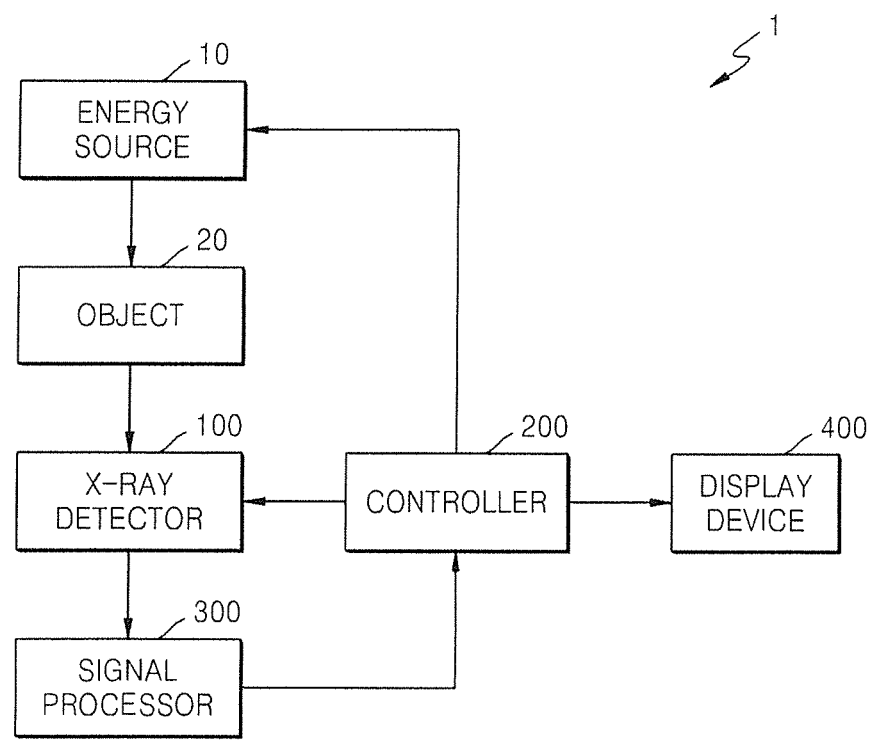
FIG. 1 is a schematic block diagram illustrating an X-ray detection system according to an example embodiment.

Reference will now be made in detail to example embodiments, examples of which are illustrated in the accompanying drawings. However, the present invention may be embodied in many different forms and should not be construed as being limited to embodiments set forth herein. Rather, these embodiments are provided so that this disclosure will be thorough and complete, and will fully convey the scope of the invention to those skilled in the art. Like reference numerals denote like elements throughout the drawings.

As used herein, the term "and/or" includes any and all combinations of one or more of the associated listed items. It will be understood that, although the terms 'first', 'second', etc. may be used herein to describe various elements, components, and/or sections, these elements, components, and/or sections should not be limited by these terms. These terms are only used to distinguish one element, component, or section from another element, component, or section. Thus, a first element, component, or section discussed below could be termed a second element, component, or section without departing from the teachings of example embodiments.

The terminology used herein is for the purpose of describing particular embodiments only and is not intended to be limiting of the invention. As used herein, the singular forms are intended to include the plural forms as well, unless the context clearly indicates otherwise. It will be further understood that the terms "comprises" and/or "comprising," when used in this specification, specify the presence of stated components, steps, operations, and/or elements, but do not preclude the presence or addition of one or more other components, steps, operations, and/or elements thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present invention will be described with reference to the accompanying drawings.

FIG. 1 is a schematic block diagram illustrating an X-ray detection system 1 according to an example embodiment.

With reference to FIG. 1, the X-ray detection system 1 includes an energy source 10, an X-ray detector 100, a controller 200, a signal processor 300, and a display device 400.

The energy source 10 is a device for irradiating radiation such as X-rays toward an object 20.

The X-ray detector 100 is in a flat panel and includes a plurality of photosensitive pixels for sensing X-rays. The X-ray detector 100 includes a plurality of photodiodes and a plurality of switching devices which detect an amount of the X-rays transmitted through the object 20. If the X-rays are applied to the photodiodes when a reverse bias is applied to the photodiodes, an electric detection signal corresponding to the transmitted amount of the X-rays is generated by each of the photodiodes. The electric detection signal is read out and then input to a readout integrated circuit 150 (see FIG. 2) via a plurality of data lines DL.

The X-ray detector 100 performs an offset read out for obtaining an offset image when X-rays are not irradiated and an X-ray read out for obtaining an X-ray image when X-rays are irradiated. In addition, the X-ray detector 100 performs offset adjustment by scrubbing prior to the offset read out and performs signal initiation by scrubbing prior to the X-ray read out. During the scrubbing, gate scanning may be performed two or more times.

The controller 200 controls operations of the energy source 10, the X-ray detector 100, and the display device 400 to form an X-ray image which has been offset-corrected.

The controller 200 controls operations of the energy source 10, the X-ray detector 100, and the display device 400 to generate an offset-corrected X-ray image. The controller 200 controls when and for how long the energy source 10 radiates X-rays. The controller 200 also controls driving sequences for obtaining an offset image of the X-ray detector 100 and for obtaining an X-ray image.

The signal processor 300 converts the detection signal output from the X-ray detector 100 into a digital signal. The signal processor 300 generates an offset image and an X-ray image from the digital signal. The current offset image may then be averaged with a previously generated offset image to obtain an updated offset image. The signal processor 300 generates an offset-corrected X-ray image by subtracting the updated offset image, which is generated before X-rays are radiated, from the X-ray image.

The display device 400 displays the offset-corrected X-ray image. The display device 400 may be a liquid crystal display (LCD), an organic light-emitting display device, a plasma display panel, or the like.

Figure 2:
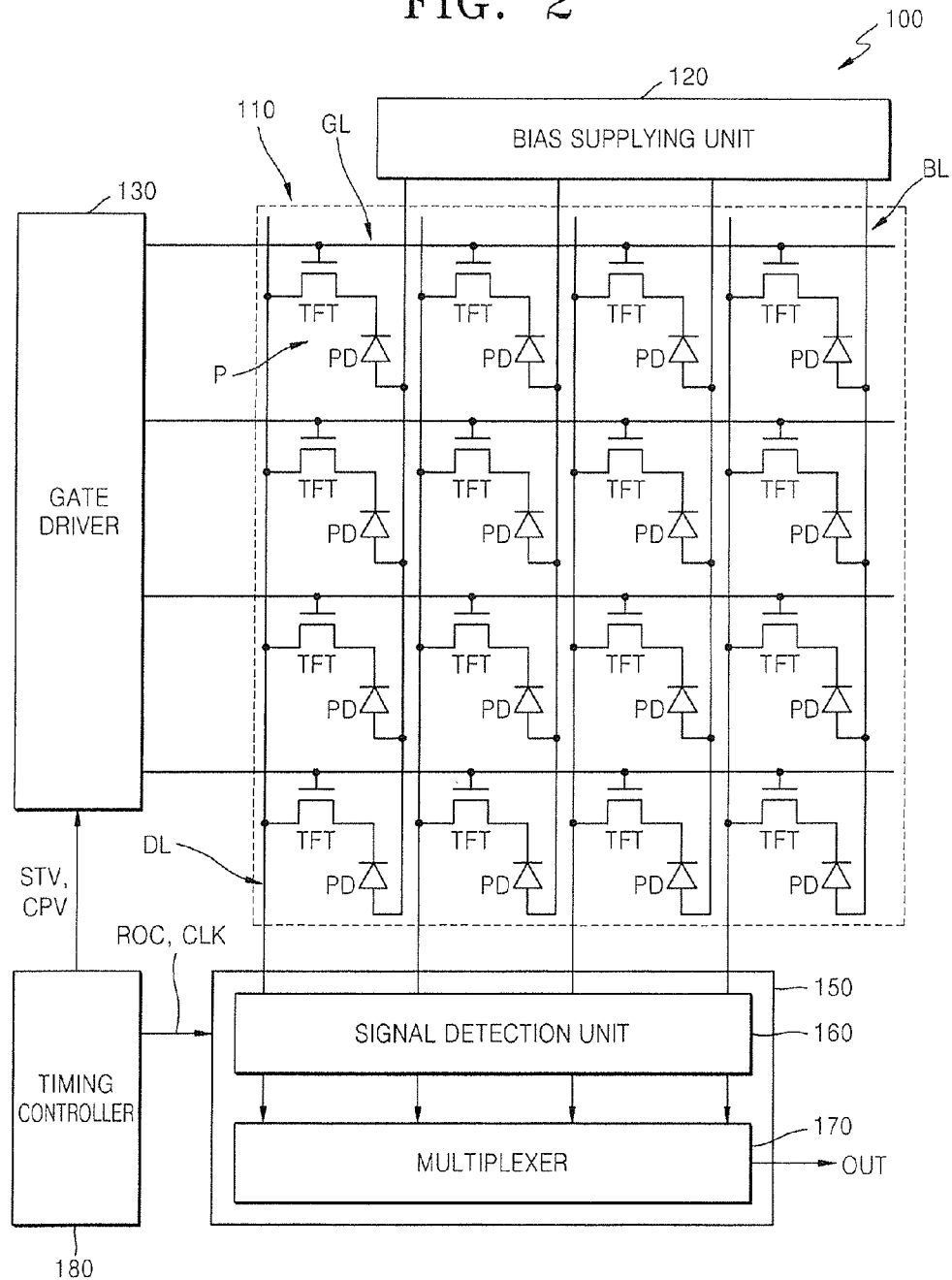
FIG. 2 is a schematic view illustrating a structure of the X-ray detector of FIG. 1, according to an example embodiment.
Figure 3:
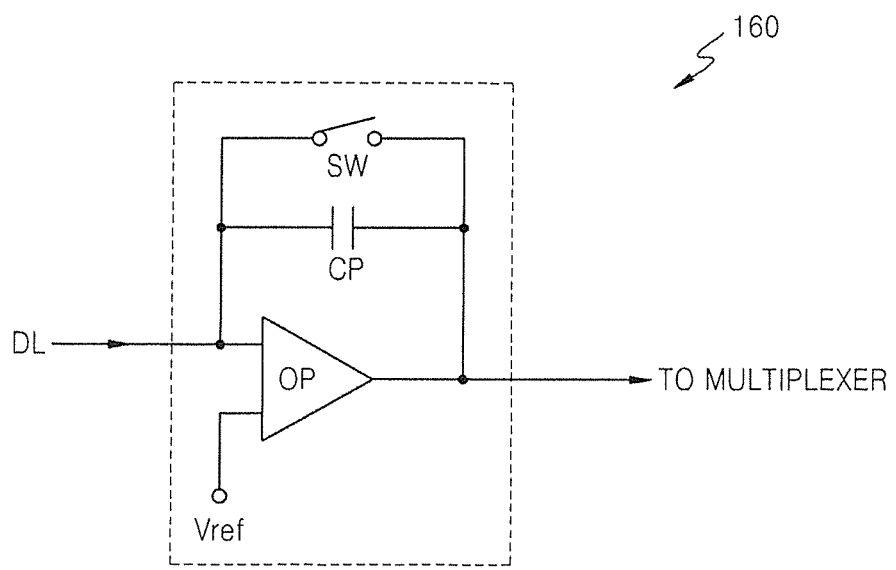
FIG. 3 is a circuit diagram illustrating a structure of the signal detection unit of FIG. 2, according to an example embodiment.

FIG. 2 is a schematic view illustrating a structure of the X-ray detector 100 of FIG. 1, according to an example embodiment. FIG. 3 is a circuit diagram illustrating a structure of a signal detection unit 160 of FIG. 2, according to an example embodiment.

The X-ray detector 100 includes a panel 110, a bias supplying unit 120, a gate driver 130, the read out integrated circuit 150, and a timing controller 180. The read out integrated circuit 150 includes the signal detection unit 160 and a multiplexer 170.

The panel 110 senses the X-rays emitted from the energy source 100, converts a sensed signal into an electric detection signal through a photoelectric transformation, and outputs the electric detection signal. The panel 110 includes a plurality of photosensitive pixels P that are arrayed in a matrix form near intersections where a plurality of gate lines GL and a plurality of data lines DL intersect. The plurality of gate lines GL may be arranged substantially orthogonal to the plurality of data lines DL. In FIG. 2, 16 photosensitive pixels P are exemplarily arrayed in 4 columns and 4 rows, but the present invention is not limited thereto. The number of photosensitive pixels P may be variously selected.

Each of the photosensitive pixels P includes a photodiode PD that senses X-rays and outputs a detection signal such as a photodetection voltage and at least one switching device for transmitting the detection signal output from the photodiode PD in response to a gate pulse. The switching device may be, for example, a thin film transistor. Hereinafter, an exemplary embodiment of the switching device will be described as a thin film transistor. The photosensitive pixels P are not limited to the above example and may further include a capacitor.

Each of the photodiodes PD senses X-rays radiated from the energy source 10, generates a signal with respect to the sensed X-rays, and outputs the signal as a detection signal. The photodiodes PD photoelectrically convert incident light into electrical signals. For example, the photodiodes PD may be PIN diodes.

The bias supplying unit 120 applies a driving voltage to the plurality of bias lines BL. The bias supplying unit 120 may apply a constant voltage to the photodiodes PD or selectively apply a reverse bias or a forward bias to the photodiodes PD.

The gate driver 130 sequentially applies gate pulses having a gate-on voltage level to the plurality of gate lines GL. Also, the gate driver 130 may apply reset pulses having a gate-on voltage level to a plurality of reset lines RL. A gate-on voltage level refers to a voltage level that turns on the transistors of the photosensitive pixels P. The transistors of the photosensitive pixels P may be turned on in response to the gate pulses or the reset pulses.

In response to the gate pulses, detection signals output from the photodiodes PD are input to the read out integrated circuit 150 via the data lines DL. The gate driver 130 may be an integrated circuit (IC). The gate driver 130 may be mounted on a side of the panel 110 or may be formed on a substrate such as the panel 110 through a thin film process.

The read out integrated circuit 150 reads out the detection signals output from the transistors when the transistors are turned on in response to the gate pulses. The read out integrated circuit 150 reads out the detection signals output from the photosensitive pixels P during an offset read out phase in which an offset image is read out, and an X-ray read out phase in which detection signals after X-rays exposure are read out.

The read out integrated circuit 150 may include the signal detection unit 160 and the multiplexer 170.

The signal detection unit 160 includes a plurality of amplifying units respectively corresponding to the plurality of data lines DL. Each amplifying unit includes an amplifier OP, a capacitor CP, and a reset device SW.

With reference to FIG. 3, the amplifier OP includes a first input terminal connected to one data line DL, a second input terminal that receives a reference voltage Vref, and an output terminal. The reference voltage Vref may be a ground voltage. The first input terminal may be an inverse input of the amplifier OP, and the second input terminal may be a non-inverse input of the amplifier OP. A signal output from the output terminal of the amplifier OP is input to the multiplexer 170.

One terminal of the capacitor CP is electrically connected to the first input terminal of the amplifier OP, and the other terminal of the capacitor CP is electrically connected to the output terminal of the amplifier OP.

The reset device SW discharges a voltage charged in the capacitor CP and resets the capacitor CP. The reset device SW is connected in parallel to the capacitor CP. One terminal of the reset device SW is electrically connected to a first terminal of the capacitor CP, and the other terminal of the reset device SW is electrically connected to a second terminal of the capacitor CP. The reset device SW may include a switch that electrically connects two terminals of the capacitor CP. When the switch of the reset device SW is switched on, the two terminals of the capacitor CP may be electrically connected to each other, and a voltage charged between the two terminals of the capacitor CP is discharged. The switch of the reset device SW is switched on during a gate scanning mode, and the data lines DL are discharged.

The multiplexer 170 receives a voltage signal from the amplifier OP of the signal detection unit 160, and sequentially outputs the voltage signal to the signal processor 300. The multiplexer 170 may include switches respectively corresponding to the amplifiers OP.

In order to control an operation of the gate driver 130, the timing controller 180 generates a start signal SW and a clock signal CPV and outputs them to the gate driver 130. Furthermore, in order to control an operation of the read out integrated circuit 150, the timing controller 180 generates a read out control signal ROC and a read out clock signal CLK and outputs them to the read out integrated circuit 150. The gate driver 130 and the read out integrated circuit 150 may operate using different clock signals.

Figure 4:
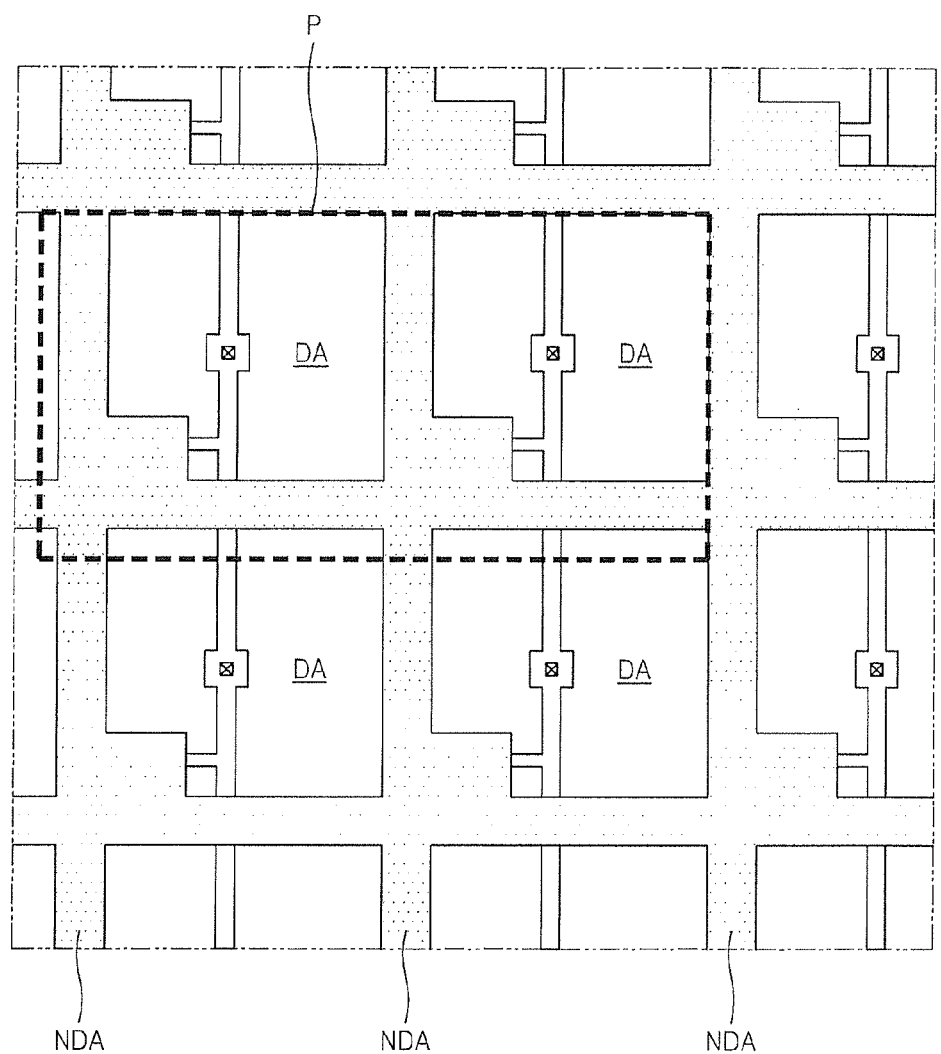
FIG. 4 is a diagram illustrating the disposition of photosensitive pixels and wires, according to an example embodiment.
Figure 5:
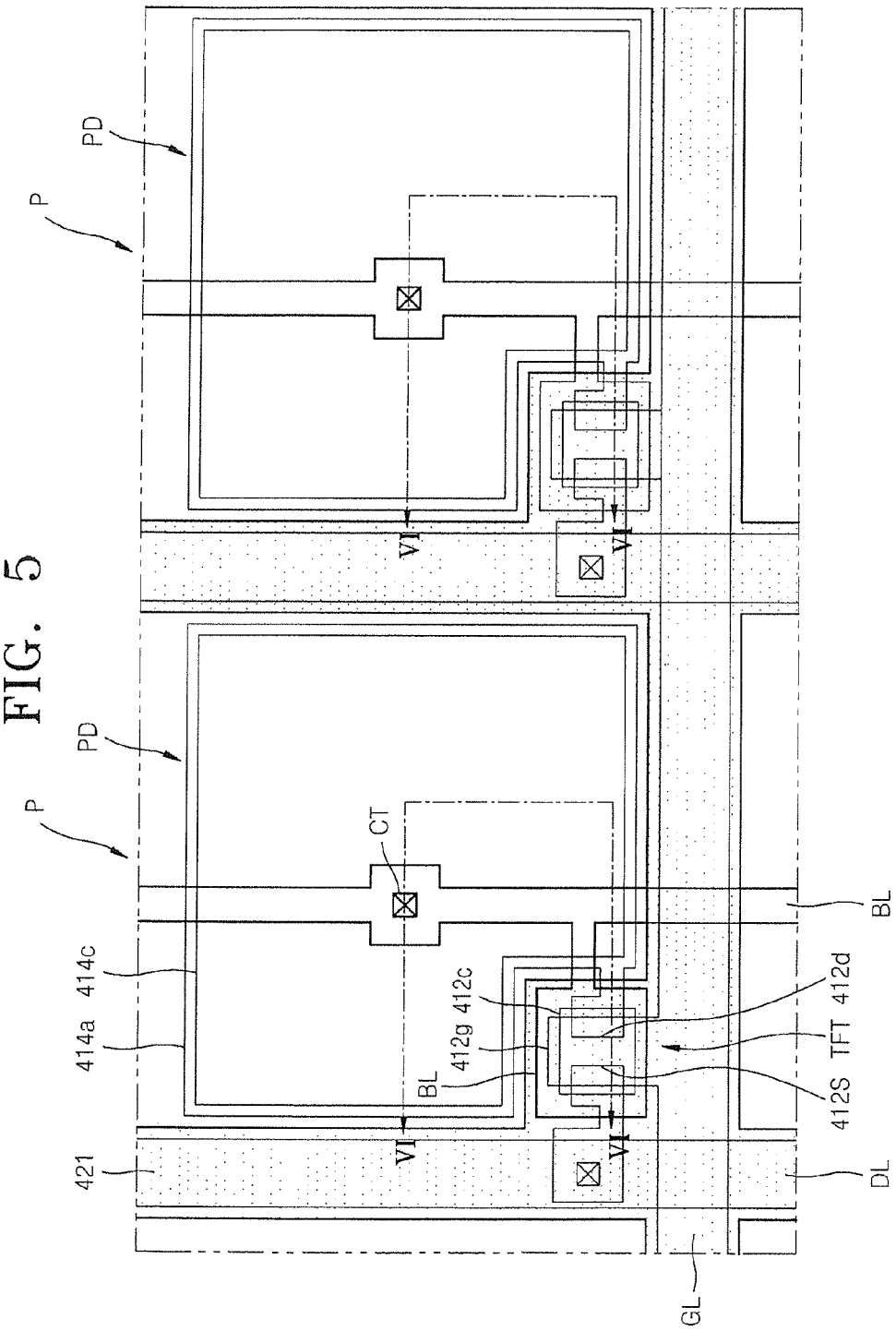
FIG. 5 is an enlarged view of one of the photosensitive pixels of FIG. 4 and surroundings, according to an exemplary embodiment.
Figure 6:
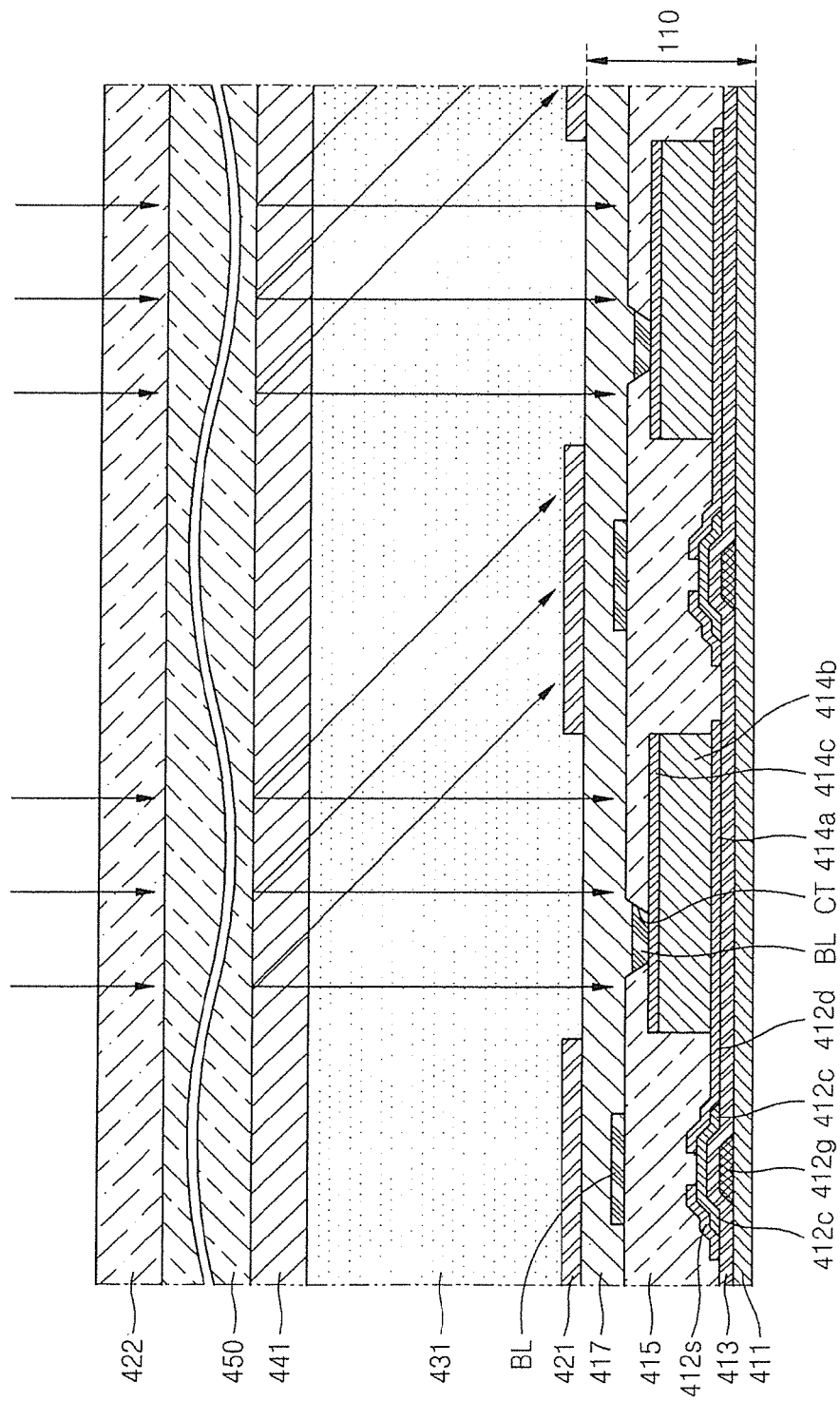
FIG. 6 is a cross-sectional view taken along line VI-VI of FIG. 5, according to an exemplary embodiment.

FIG. 4 is a diagram illustrating the disposition of photosensitive pixels and wires, according to an example embodiment. FIG. 5 is an enlarged view of one of the photosensitive pixels of FIG. 4 and surroundings, according to an exemplary embodiment. FIG. 6 is a cross-sectional view taken along line VI-VI of FIG. 5, according to exemplary embodiment.

In an embodiment, the photosensitive pixel P includes a light detection area DA and a non-detection area NDA. The light detection area DA generates a signal current according to incident light. The non-detection area NDA does not detect light and is arranged adjacent to the light detection area DA. The light detection area DA includes a photodiode PD. The non-detection area NDA includes a circuit unit including at least one thin film transistor TFT and wires.

The photosensitive pixels P are disposed on a substrate 411. The substrate 411 may be formed of a transparent material such as glass or plastic. A buffer layer may be formed on a top surface of the substrate 411 so as to prevent or protect from the permeation of impurities into the substrate 411 and planarize the surface thereof. The buffer layer is not an essential element, and may be optionally formed, if desired.

Gate lines GL are disposed on the substrate 411 to extend along a first direction. The gate lines GL transmit gate pulses to a device. A gate insulating layer 413 is disposed on the gate lines GL to insulate the gate lines GL. Data lines DL are disposed on the gate insulating layer 413 to extend along a second direction intersecting the first direction. The data lines DL transmit a detection signal from the device to the read out integrated circuit 150 (see FIG. 2). The second direction may be orthogonal to the first direction.

TFTs are formed adjacent to intersections where the gate lines GL and the data lines DL intersect one another. The TFTs are turned on in response to the gate pulses and transmit signals output from photodiodes PD to the data lines DL. Each TFT includes a gate electrode 412g, a semiconductor pattern 412c, a source electrode 412s, and a drain electrode 412d. The gate electrode 412g is branched from the corresponding gate line GL and transmits the gate pulse. The gate insulating layer 413 is formed on the gate electrodes 412g so as to insulate the gate electrodes 412g from the semiconductor patterns 412c. The semiconductor patterns 412c are formed on the gate insulating layer 413 so as to correspond to the respective gate electrodes 412g. The semiconductor pattern 412c of the TFT may be formed of a semiconductor material, such as hydrogenated amorphous silicon or crystalline silicon, but is not limited thereto. For example, the semiconductor pattern 412c may be formed of an oxide semiconductor. The source electrode 412s and the drain electrode 412d contact the semiconductor pattern 412c. The drain electrode 412d is electrically connected to a lower portion of the photodiode PD. The source electrode 412s is branched from the corresponding data line DL. An ohmic contact pattern may be further formed between the semiconductor pattern 412c and the source electrode 412s and between the semiconductor pattern 412c and the drain electrode 412d in order to reduce a contact resistance therebetween. The TFTs have been described as an inverted staggered type, but are not limited thereto. In other embodiments, the TFTs may be in a staggered configuration, a coplanar configuration, or an inverted coplanar configuration.

The photodiodes PD may be PIN diodes. The photodiodes PD may be formed on the gate insulating layer 413. Each photodiode PD includes a lower electrode 414a, a semiconductor unit 414b, and an upper electrode 414c. The lower electrode 414a of the photodiode PD is formed on the gate insulating layer 413 and is electrically connected to the drain electrode 412d of the TFT. The lower electrode 414a is formed using the same method used to form the drain electrode 412d of the TFT and may be directly connected to the drain electrode 412d of the TFT. In another embodiment, the lower electrode 414a of the photodiode PD is formed using a different method from that used to form the drain electrode 412d and may be formed below or above the drain electrode 412d of the TFT.

The semiconductor unit 414b is formed on the lower electrode 414a and converts light to an electrical signal. The semiconductor unit 414b includes an N-type semiconductor layer, an intrinsic semiconductor layer, and a P-type semiconductor layer. The intrinsic semiconductor layer may be formed to be relatively thicker than the N-type semiconductor layer and the P-type semiconductor layer.

The upper electrode 414c is formed on the semiconductor unit 414b. The upper electrode 414c may be formed of a transparent conductive material, which transmits light to the semiconductor unit 414b. For example, the upper electrode 414c may be formed of at least one transparent conductive material, such as ITO, IZO, ZnO, or $In_2O_3$.

A device passivation layer 415 is formed over the entire surface of the substrate 411 to cover the TFTs, wires, and the photodiodes PD. The device passivation layer 415 protects all the devices disposed therebelow from the outside. The device passivation layer 415 may be formed as a single layer or layers including an inorganic insulating material or an organic insulating material. A contact hole CT is formed in a portion of the device passivation layer 415 that corresponds to each photodiode PD. A bias line BL is electrically connected to the photodiode PD via the contact hole CT.

The bias line BL overlaps with the photodiode PD and is branched in the second direction. The bias line BL may be formed parallel to the data line DL, but is not limited thereto. In another embodiment, the bias line BL may be formed parallel to the gate line GL. A portion of the bias lines BL is branched in the first direction intersecting the second direction so as to overlap with the TFT. The bias line BL is electrically connected to the upper electrode 414c via the contact hole CT. The bias line BL receives a reverse bias or a forward bias from the bias supplying unit 120 (see FIG. 2) and transmits the reverse bias or the forward bias to the photodiode PD.

An insulating layer 417 may be formed on the device passivation layer 415 so as to cover the bias lines BL. The insulSating layer 417 prevents the permeation of impurities and planarizes a surface of the resultant device structure. The insulating layer 417 may have a single-layered structure or multi-layered structure including an inorganic insulating material or an organic insulating material.

Shielding parts 421 are formed on the insulating layer 417. The shielding parts 421 are formed so as to overlap with the non-detection areas NDA and shield the TFTs, the gate lines GL, and the data lines DL. The shielding parts 421 block light to be incident on the non-detection areas NDA. The shielding parts 421 include at least one of an acryl-based organic material, an overcoat material, and a black matrix.

Any acryl-based organic material that enables the shielding parts 421 to be formed for each pixel unit in a display panel manufacturing process and absorbs light may be used. When a layer formed of the acryl-based organic material is used as the shielding parts 421, a light-blocking rate of the shielding parts 421 may be increased by adding a dye or without performing a process of irradiating I-line UV light. Experiment results show that in a case where the process of irradiating I-line UV is not performed when a layer formed of the acryl-based organic material is used, the light-blocking rate is approximately 25 to 35% less than that in a case where the process of irradiating I-line UV is performed.

An overcoat material uses an acryl-based material as a raw material. The overcoat material is used to form a black matrix in a display device.

The black matrix may include a carbon black-based material or a chromium-based material.

The panel 110 as used herein is intended to include the substrate 411, the TFTs, the photodiodes PD, and the insulating layer 417 covering them. The thickness of the panel 110 is about 1 μm to about 3 μm. The shielding parts 421 are formed on the panel 110 to shield the non-detection areas NDA, and thus, prevent light from being incident on the non-detection areas NDA.

A scintillator layer 450 is disposed on the panel 110. The scintillator layer 450 is a light wavelength conversion layer that converts X-rays to visible light. In particular, the scintillator layer 450 converts X-rays with a wavelength of about 0.01 nm to tens nanometers to green light with a wavelength of 450 nm to 600 nm. The thickness of the scintillator layer 450 is about 300 μm to about 700 μm. The scintillator layer 450 may be a planar scintillator bundle. The scintillator layer 450 includes at least one of CsI or GdOS, but is not limited thereto. For example, the scintillator layer 450 may include NaI(TI), CsI(TI), CaI(Na), LiI(Eu), CaF2(Eu), or the like. In this regard, NaI is an alkali metal crystal, and TI is an impurity added as an activator.

An adhesive layer 431 is formed between the scintillator layer 450 and the panel 110. The adhesive layer 431 adheres the scintillator layer 450 to the panel 110. The thickness of the adhesive layer 431 is about 50 μm to about 100 μm. A passivation layer 441 may be further formed between the adhesive layer 431 and the scintillator layer 450. The passivation layer 441 protects the scintillator layer 450 and may be formed on both top and bottom surfaces of the scintillator layer 450. Reference numeral 422 denotes a passivation layer formed on the top surface of the scintillator layer 450. The passivation layer 441 includes parylene, and the thickness of the passivation layer 441 is about 10 μm to about 30 μm.

X-rays are converted to visible light by the scintillator layer 450, pass through the passivation layer 441 and the adhesive layer 431, and then are incident on the photosensitive pixels P of the panel 110. The converted light is scattered while passing through the passivation layer 441 and the adhesive layer 431. The scattered light is incident on an adjacent photosensitive pixel P. That is, the light scattered by the layers between the scintillator layer 450 and the panel 110 affects the adjacent photosensitive pixel P, and thus, blurring occurs. In particular, electrons or holes may be abnormally generated at a side surface of the photodiode PD because light which is to be mostly incident on the adjacent photosensitive pixel P is scattered so that the scattered light affects the photodiode PD of the corresponding photosensitive pixel P. Interference by such scattered light is a main factor for reducing a modulation transfer function (MTF) of the X-ray detector 100. Experimentally, a refractive index of the scintillator layer 450 is about 1.8 to about 1.9, which is greater than that of the passivation layer 441 and the adhesive layer 431. That is, light scattering occurs mostly in the passivation layer 441 and the adhesive layer 431. Experimentally, an MTF value of an X-ray detector not including the passivation layer 441 and the adhesive layer 431 is lower than that of an X-ray detector including the passivation layer 441 and the adhesive layer 431. Consequently, the reproducibility of a fine portion of a final image is deteriorated by the passivation layer 441 and the adhesive layer 431, and thus, relatively accurate results may not be obtained.

The scattered light mainly passes through the non-detection area NDA of the adjacent photosensitive pixel P and is then incident on the photodiode PD. The photosensitive pixels P have a structure in which the non-detection area NDA and the light detection area DA are alternately arranged, and thus, the non-detection area NDA lies on an optical path. Thus, the shielding parts 421 may be disposed on the non-detection area NDA so as to prevent the scattered light from being incident on the photodiode PD of the adjacent photosensitive pixel P.

Figure 7:
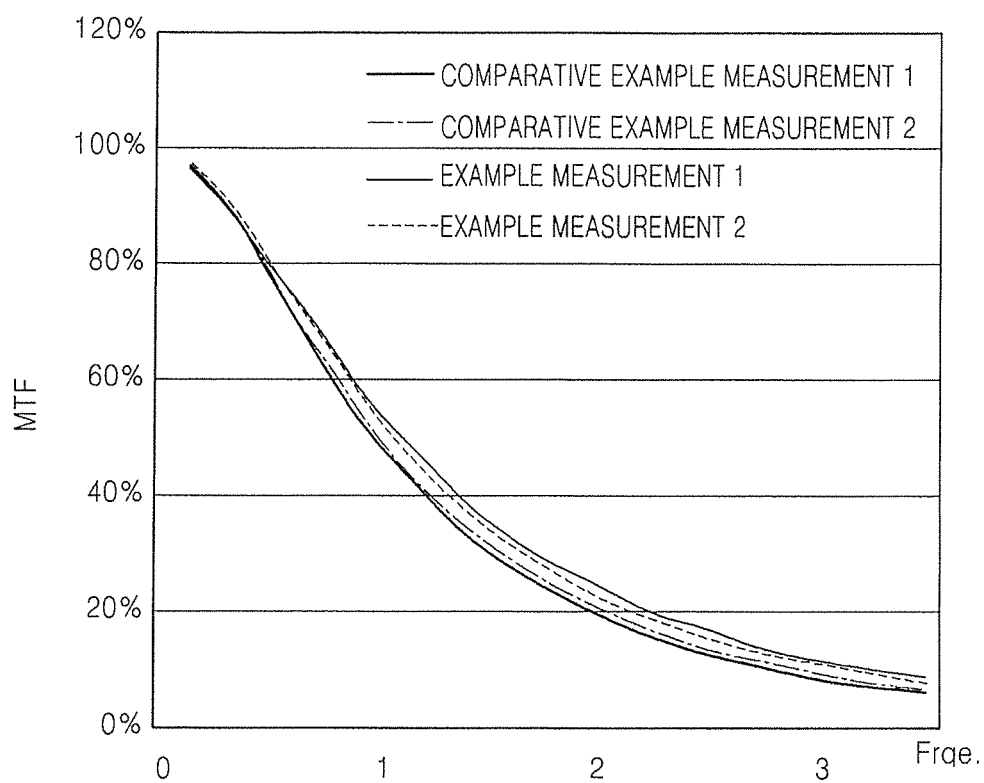
FIG. 7 is a graph showing comparison results of MTF values of an Example and a Comparative Example.

FIG. 7 is a graph showing comparison results of MTF values of an X-ray detector according to an Example including the shielding parts 421, as illustrated in FIG. 6, and an X-ray detector according to a Comparative Example. The X-ray detector of the Comparative Example does not include the shielding parts 421.

TABLE 1

| Frequency | Comparative Example | | Example | |
|---|---|---|---|---|
| | measurement 1 | measurement 2 | measurement 1 | measurement 2 |
| 1 | 48.6% | 49.1% | 52.8% | 52.2% |
| 2 | 19.6% | 20.5% | 24.1% | 22.4% |
| 3 | 8.7% | 9.3% | 11.6% | 10.6% |

As shown in Table 1 and FIG. 7, the MTF value of the X-ray detector of the Example is greater than that of the X-ray detector of the Comparative Example. From the results, it is confirmed that the X-ray detector of the Example has a high MTF, and thus, may display a final image with high resolution and contrast.

Figure 8:
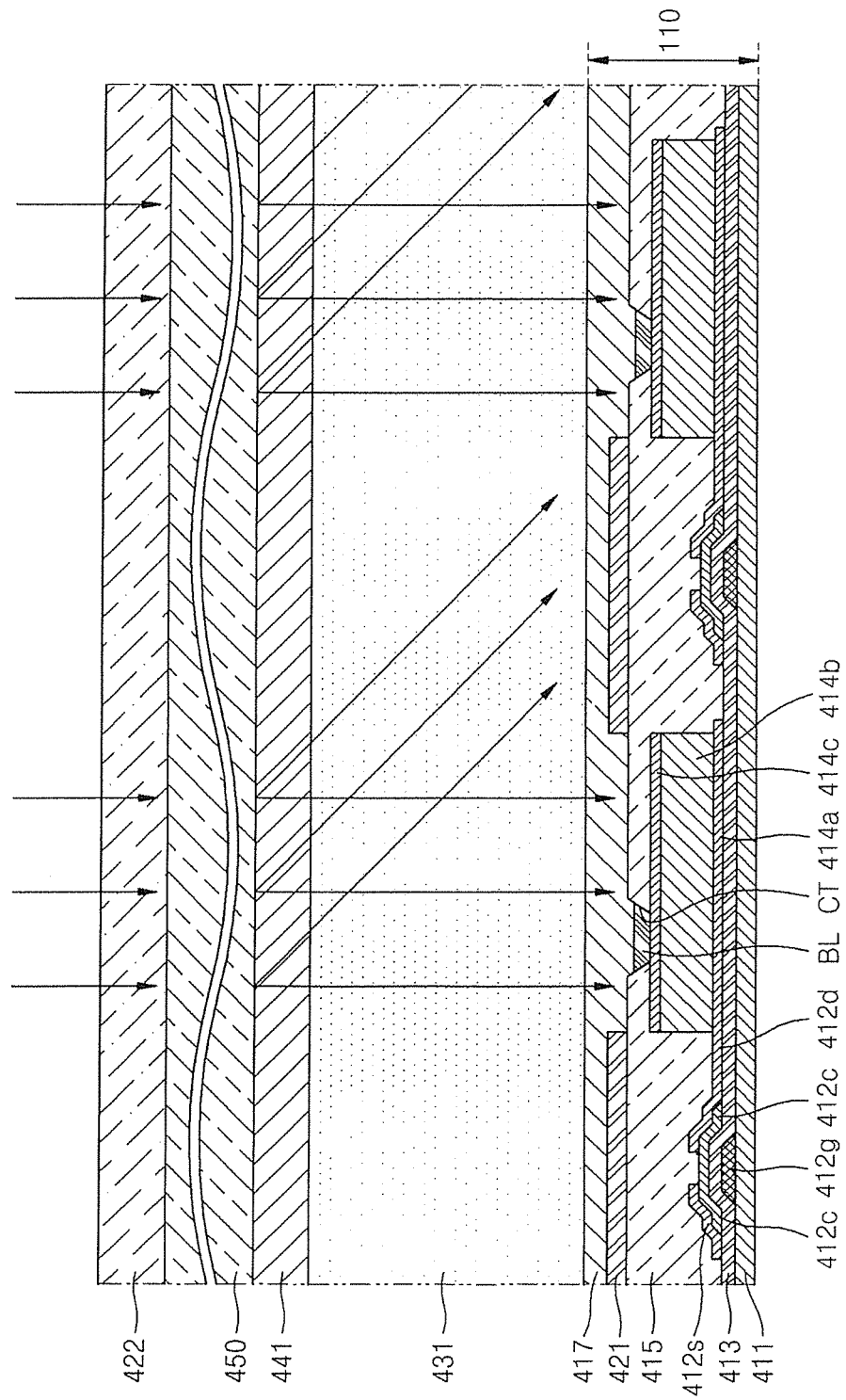
FIG. 8 is a cross-sectional view of an X-ray detector according to another embodiment.

FIG. 8 is a cross-sectional view of an X-ray detector according to another embodiment.

The X-ray detector illustrated in FIG. 8 has the same structure as that of the X-ray detector of FIG. 6 in that the X-ray detector of FIG. 8 includes the panel 110 including the light detection areas DA and the non-detection areas NDA, the adhesive layer 431, the scintillator layer 450, and the passivation layer 441. However, the X-ray detector of FIG. 8 has a different structure from that of the X-ray detector of FIG. 6 in that, while the shielding parts 421 of FIG. 6 are formed on the insulating layer 417 on the panel 110, the shielding parts 421 of FIG. 8 are formed between the device passivation layer 415 and the insulating layer 417. The other elements of the X-ray detector of FIG. 8 have the same or similar functions to those of the corresponding elements of the X-ray detector of FIG. 6, and thus, a detailed description thereof is not provided herein.

The shielding parts 421 are disposed between the device passivation layer 415 and the insulating layer 417. The shielding parts 421 are formed overlapping with the corresponding non-detection areas NDA so as to shield TFTs, gate lines GL, and data lines DL. The shielding parts 421 are formed using the same method used to form bias lines BL, and thus, may be formed in an integrated form with the bias lines BL that overlap with the TFTs. However, examples of the shielding parts 421 are not limited thereto. For example, the shielding parts 421 may be formed above or below the bias lines BL by using a different method from that used to form the bias lines BL. The shielding parts 421 may include at least one of an acryl-based organic material, an overcoat material, and a black matrix. When the shielding parts 421 are formed in an integrated form with the bias lines BL, each shielding part 421 may have a double-layered structure including a lower layer formed of a conductive material such as a metal and an upper layer including at least one of an acryl-based organic material, an overcoat material, and a black matrix.

Due to the structure in which the shielding parts 421 are disposed between the device passivation layer 415 and the insulating layer 417, light which is scattered by the adhesive layer 431 and the passivation layer 441 may be prevented from being incident on the photodiode PD of the adjacent photosensitive pixel P.

Although not illustrated in FIG. 8, the shielding parts 421 may be formed on both the device passivation layer 415 and the insulating layer 417. In this case, the shielding parts 421 are further formed on the device passivation layer 415, as well as on the insulating layer 417, and thus, such a structure may more completely prevent the scattered light from being incident on the adjacent photosensitive pixel P.

Figure 9:
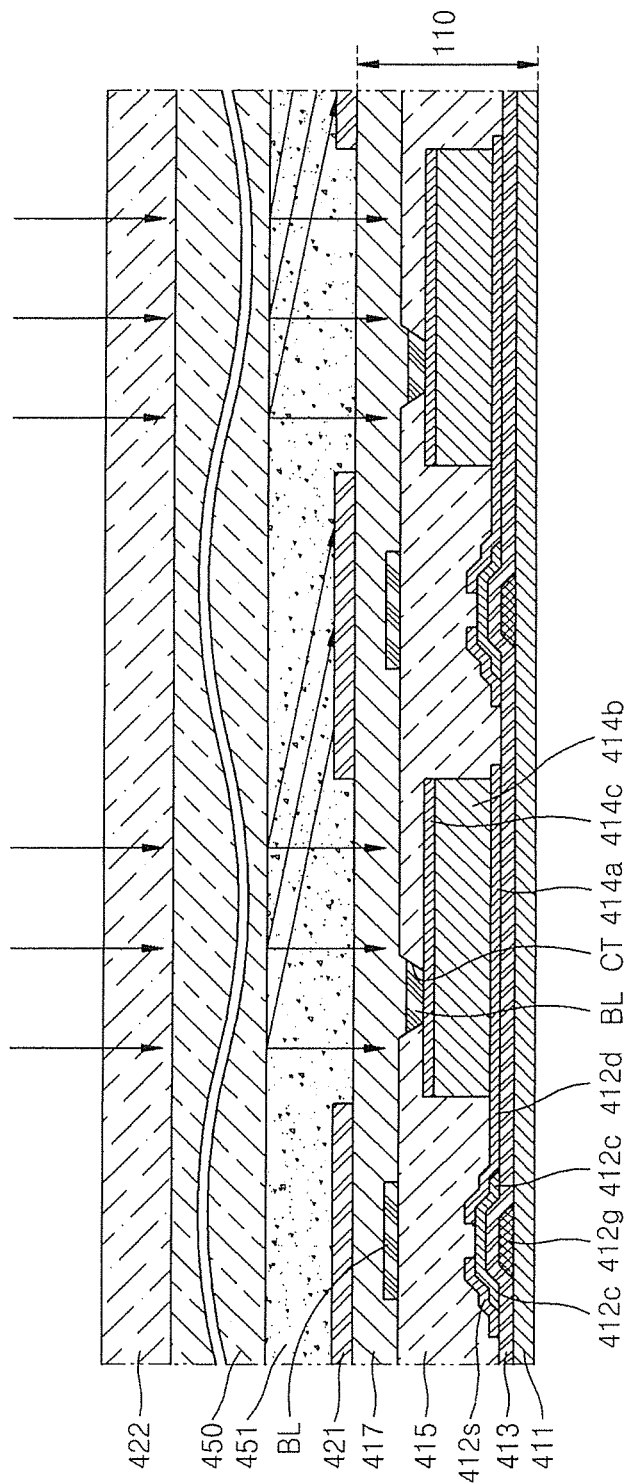
FIG. 9 is a cross-sectional view of an X-ray detector according to another embodiment.

FIG. 9 is a cross-sectional view of an X-ray detector according to another embodiment.

The X-ray detector illustrated in FIG. 9 has the same structure as that of the X-ray detector of FIG. 6 in that the X-ray detector of FIG. 9 includes the panel 110 including the light detection areas DA and the non-detection areas NDA and the scintillator layer 450. However, the X-ray detector of FIG. 9 has a different structure from that of the X-ray detector of FIG. 6 in that, while the X-ray detector of FIG. 6 includes the adhesive layer 431 that adheres the scintillator layer 450 to the panel 110 and the passivation layer 441 between the adhesive layer 431 and the scintillator layer 450, the X-ray detector of FIG. 9 includes a scintillator seed layer 451 between the panel 110 and the scintillator layer 450. As is the case for the X-ray detector of FIG. 6, the shielding parts 421 are formed on the insulating layer 417. The other elements of the X-ray detector of FIG. 9 have the same or similar functions to those of the corresponding elements of the X-ray detector of FIG. 6, and thus, a detailed description thereof is not provided herein.

The scintillator seed layer 451 includes a starting material for growing a scintillator crystal. The scintillator crystal is grown by the scintillator seed layer 451 to form the scintillator layer 450. In the present embodiment, the scintillator seed layer 451 directly grows the scintillator crystal, and thus, the adhesive layer 431 for adhering the scintillator layer 450 and the panel 110 is not needed. In addition, the passivation layer 441 is not formed on a bottom surface of the scintillator layer 450.

Figure 10:
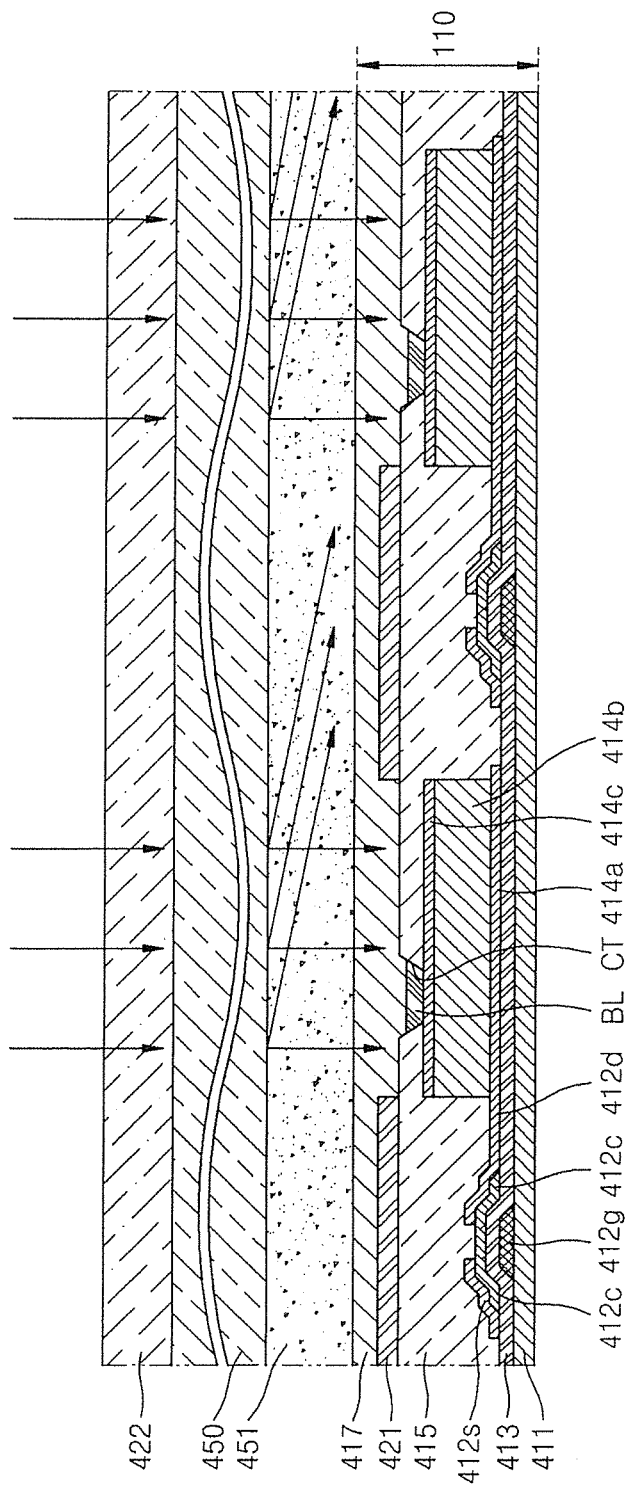
FIG. 10 is a cross-sectional view of an X-ray detector according to another embodiment.

FIG. 10 is a cross-sectional view of an X-ray detector according to another embodiment.

The X-ray detector of FIG. 10 has the same structure as that of the X-ray detector of FIG. 8 in that the X-ray detector of FIG. 10 includes the panel 110 including the light detection areas DA and the non-detection areas NDA. However, the X-ray detector of FIG. 10 has a different structure from that of the X-ray detector of FIG. 8 in that, while the X-ray detector of FIG. 8 includes the adhesive layer 431 that adheres the scintillator layer 450 to the panel 110 and the passivation layer 441 between the adhesive layer 431 and the scintillator layer 450, the X-ray detector of FIG. 10 includes a scintillator seed layer 451 between the panel 100 and the scintillator layer 450. As is the case for the X-ray detector of FIG. 8, the shielding parts 421 are formed between the passivation layer 415 and the insulating layer 417.

Although not illustrated in FIG. 10, the shielding parts 421 may be formed on both the device passivation layer 415 and the insulating layer 417. In this case, the shielding parts 421 are further formed on the device passivation layer 415, as well as on the insulating layer 417, and thus, such a structure may more completely prevent the scattered light from being incident on the adjacent photosensitive pixel P.

Unlike the X-ray detectors of FIGS. 6 and 8, the X-ray detectors of FIGS. 9 and 10 do not include the adhesive layer 431 and the passivation layer 441 below the scintillator layer 450. Thus, a distance between the scintillator layer 450 and the panel 100 that detects light is small enough that a probability of interference by light scattering is low, as compared to the X-ray detectors of FIGS. 6 and 8. However, the interference by light scattering is not completely prevented, and thus, the shielding parts 421 are needed so that the MTF value of the X-ray detector is not reduced.

As described above, according to the one or more embodiments of the present invention, an X-ray detector may have an improved MTF, and thus, the light sensing efficiency of the X-ray detector may be increased.

While the present invention has been particularly shown and described with reference to exemplary embodiments thereof, it will be understood by those of ordinary skill in the art that various changes in form and details may be made therein without departing from the spirit and scope of the present invention as defined by the following claims, and equivalents thereof.

What is claimed is:

1. An X-ray detector comprising:
   a substrate divided into a light detection area and a non-detection area and comprising a plurality of pixels;
   a photodiode on the light detection area;
   a thin film transistor on the non-detection area and electrically connected to a lower portion of the photodiode;
   a plurality of wires electrically connected to the thin film transistor and positioned on the non-detection area;
   at least one insulating layer disposed so as to cover at least the thin film transistor and the plurality of wires;
   a scintillator layer disposed on the at least one insulating layer over an entire surface of the substrate; and
   a shielding part disposed between the at least one insulating layer and the scintillator layer to shield the non-detection area.

2. The X-ray detector of claim 1, further comprising an adhesive layer between the shielding part and the scintillator layer.

3. The X-ray detector of claim 2, further comprising a passivation layer between the adhesive layer and the scintillator layer.

4. The X-ray detector of claim 1, further comprising a scintillator seed layer between the shielding part and the scintillator layer.

5. The X-ray detector of claim 1, wherein the shielding part comprises at least one of an acryl-based organic material, an overcoat material, and a black matrix (BM).

6. The X-ray detector of claim 1, further comprising a device passivation layer that covers at least the thin film transistor and the photodiode and is disposed below the insulating layer; and
   a bias line that is disposed on the device passivation layer and is electrically connected to an upper portion of the photodiode through a contact hole.

7. The X-ray detector of claim 6, wherein the bias line is branched to be overlapped with the thin film transistor.

8. The X-ray detector of claim 6, further comprising an additional shielding part disposed between the device passivation layer and the insulating layer to shield the non-detection area.

9. The X-ray detector of claim 1, wherein the scintillator layer comprises at least one of CsI and GdOS.

10. An X-ray detector comprising:
    a substrate divided into a light detection area and a non-detection area and comprising a plurality of pixels;
    a photosensitive element on the light detection area;
    a circuit unit on the non-detection area and electrically connected to a lower portion of the photosensitive element;
    a plurality of wires on the non-detection area and electrically connected to the circuit unit;
    a device passivation layer covering at least the circuit unit and the plurality of wires;
    an insulating layer covering the device passivation layer;
    a light wavelength conversion layer on the insulating layer over an entire surface of the substrate; and
    a shielding part disposed between the insulating layer and the light wavelength conversion layer to shield the non-detection area.

11. The X-ray detector of claim 10, further comprising an adhesive layer between the shielding part and the light wavelength conversion layer.

12. The X-ray detector of claim 11, further comprising a passivation layer between the adhesive layer and the light wavelength conversion layer.

13. The X-ray detector of claim 10, further comprising a seed layer between the shielding part and the light wavelength conversion layer.

14. The X-ray detector of claim 10, wherein the shielding part comprises at least one of an acryl-based organic material, an overcoat material, and a black matrix (BM).

15. The X-ray detector of claim 10, further comprising an additional shielding part disposed between the device passivation layer and the insulating layer to shield the non-detection area.

16. The X-ray detector of claim 10, wherein the light wavelength conversion layer comprises at least one of CsI and GdOS.

17. An X-ray detector comprising:
    a substrate divided into a light detection area and a non-detection area and comprising a plurality of pixels;
    a photodiode on the light detection area;
    a thin film transistor on the non-detection area and electrically connected to a lower portion of the photodiode;
    a plurality of wires electrically connected to the thin film transistor and positioned on the non-detection area;
    at least one insulating layer disposed so as to cover at least the thin film transistor and the plurality of wires;
    a device passivation layer that covers at least the thin film transistor and the photodiode and is disposed below the insulating layer;
    a scintillator layer disposed on the at least one insulating layer over an entire surface of the substrate; and
    a shielding part disposed between the device passivation layer and the at least one insulating layer to shield the non-detection area.

* * * * *